United States Patent [19]

Denny

[11] Patent Number: 4,922,127

[45] Date of Patent: May 1, 1990

[54] PHASE SHIFT ARRANGEMENT

[75] Inventor: Paul A. Denny, Kent, United Kingdom

[73] Assignee: Plessey Overseas Limited, Ilford, England

[21] Appl. No.: 245,154

[22] Filed: Sep. 16, 1988

[30] Foreign Application Priority Data

Sep. 17, 1987 [GB] United Kingdom ............... 8721882

[51] Int. Cl.⁵ .................... H03K 5/00; H03K 3/01
[52] U.S. Cl. .................... 307/262; 307/296.6; 307/513; 328/133; 328/155; 328/55
[58] Field of Search ........... 307/296.6, 272.2, 262, 307/291, 213, 350, 264, 331; 328/109, 133, 155, 55, 24, 168

[56] References Cited

U.S. PATENT DOCUMENTS 3,283,255 11/1966 Cogar ............................. 328/109
4,266,197 5/1981 Breithaupt ....................... 307/262
4,399,410 8/1983 Siegmund et al. ................ 328/55
4,423,382 12/1983 Becker ............................. 328/55
4,689,575 8/1987 Ott .................................. 328/109
4,700,350 10/1987 Douglas et al. ................. 328/109
4,797,575 1/1989 Lofgren .......................... 307/479

Primary Examiner—Stanley D. Miller
Assistant Examiner—Richard Roseen
Attorney, Agent, or Firm—Fleit, Jacobson, Cohn, Price, Holman & Stern

[57] ABSTRACT

A phase shift arrangement comprising bi-stable devices arranged to provide phase shifted output signals triggered by a clock pulse level. The bi-stable devices including biasing means such that the clock pulse level at which the bi-stable devices are triggered is adjusted. The adjustment of the triggering level providing an offset for the degree of phase shift between output signals.

7 Claims, 5 Drawing Sheets

PHASE SHIFT ARRANGEMENT

The present invention relates to a phase shifter and more particularly but not exclusively to such a shifter used to provide accurate phase quadrature outputs.

There is a requirement e.g. in radio receivers, to provide an arrangement for accurately phase shifting between two signals, a commonly required phase shift being of 90°.

FIG. 1 illustrates a part of a direct conversion radio receiver. A local oscillator 1 provides a frequency signal 2 which is directed to the phase shifter 3. The phase shifter 3 employs the signal 2 from the oscillator 1 to provide two signals (5, 7) in phase quadrature. The signals (5, 7) are directed to frequency mixers (9, 11) respectively where they are mixed with a received radio frequency signal 15.

A typical idealised phase shift 3 arrangement is shown in FIG. 2(a), the arrangement comprises a master 17 and slave 19 flip-flop, the local oscillator 1 providing a clock signal 21. The frequency output is half the clock frequency 21, however, with correct triggering, two output signals are provided which are in phase quadrature.

FIG. 2(b) is a practical circuit embodying the phase shifter as illustrated in FIG. 2(a). The circuit comprises two D-type flip-flop or bistable elements (17, 19) arranged in a master/slave configuration. The truth table of such flip-flop elements (17, 19) is:

| Clock | $D_{IN}$ | $O_{MAS}$ | $\overline{O}_{MAS}$ |
|---|---|---|---|
| High | 0 | 0 | 0 |
| High | 0 | 1 | 0 |
| High | 1 | 0 | 1 |
| High | 1 | 1 | 1 |

It will be appreciated from the above truth table that, with flip-flop elements (17, 19) connected as shown in FIG. 2, output signals will be provided in phase quadrature.

When a first clock high pulse is presented gates 46, 48 are enabled and gates, 54, 56 disabled. Consequently, the master flip-flop gates 50, 52 are forced to the same state as imposed at node 35 (D input), while slave flip-flop gates 58, 60 retain their previous state. When the clock goes low, the master flip-flop gates (50, 52) are disconnected from the D input, while the slave flip-flop gates 58, 60 are simultaneously coupled to the outputs of the master flip-flop gates (50, 52). The master states are thus transferred to the slave. No further changes occur at the output as the master is sunk. At the next rising edge of the clock, the slave will be decoupled from the master and retain its state, while the master will once again follow the input.

A problem with these prior phase shift arrangements is that, in switching, the delays and parasitic impedances etc. cause displacements in the true phase shift from the designed ideal. Accuracy is thus affected by the inherently asymmetric manner in which the input signal feeds through the parasitic capacitors of the output. Typically, this phase inaccuracy is of the order of 1 degree.

It is an object of the present invention to provide a phase shift arrangement allowing these problems to be substantially relieved.

According to the present invention there is provided a phase shift arrangement comprising first and second bi-stable devices, said bi-stable devices being triggered by a clock pulse signal level to output signals in a specified phase relation, each bi-stable device including biasing means whereby the clock pulse signal level for triggering the bi-stable device is displaced providing an offset in the specified phase relation of output signals.

An embodiment of the present invention will now be described, by way of example only, with reference to the accompanying drawings in which.

Figure 1:
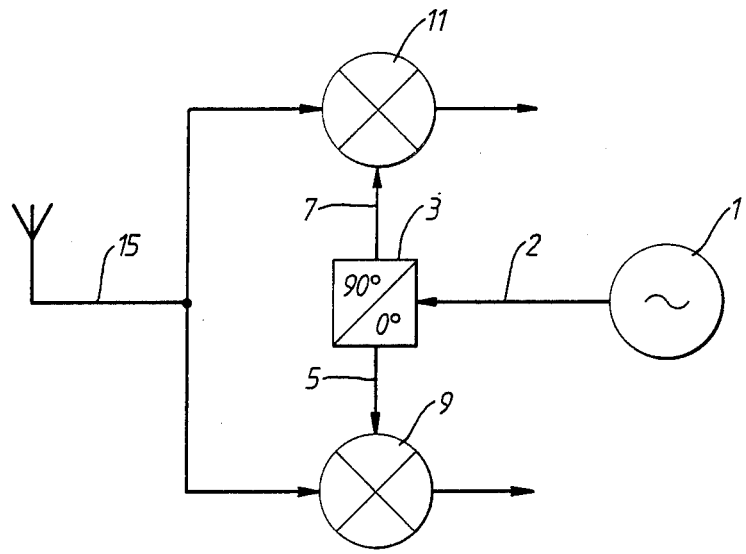
FIG. 1 illustrates in schematic form part of a direct conversion radio receiver.
Figure 2A:
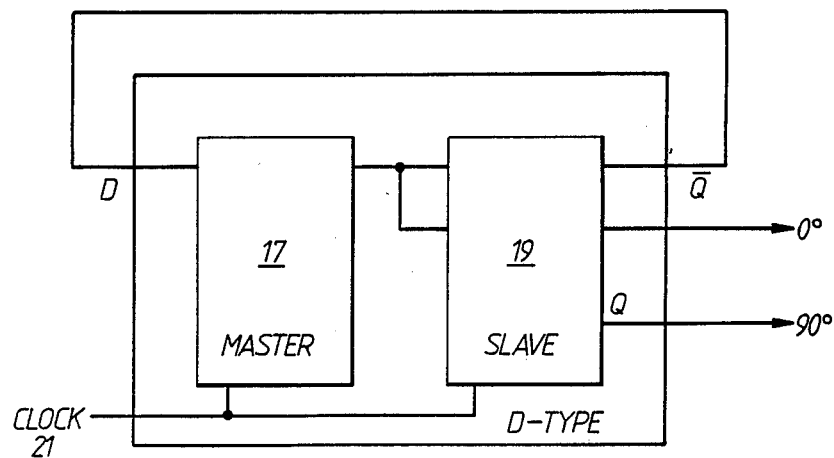
FIG. 2a illustrates schematically an idealized phase shift arrangement.
Figure 2B:
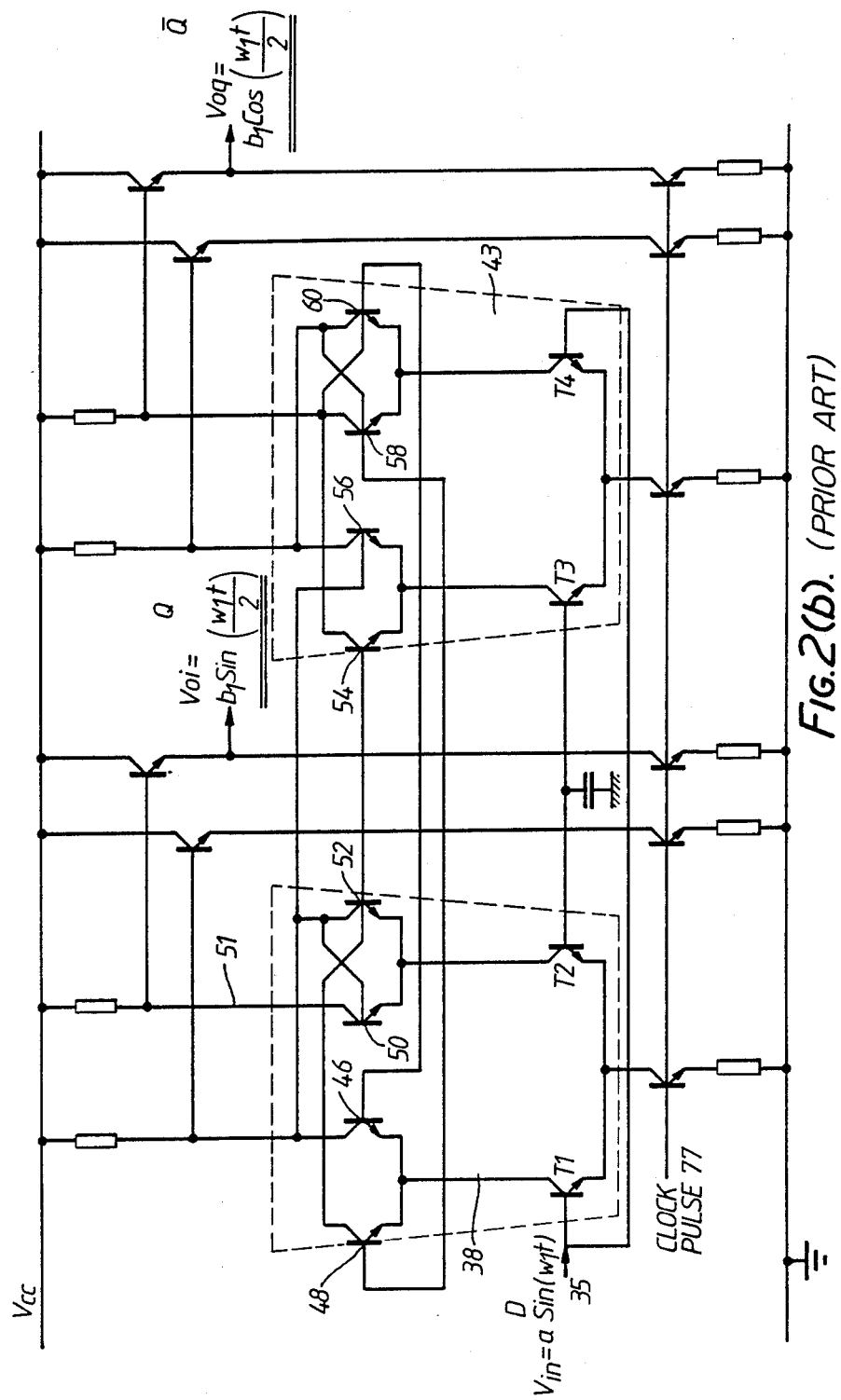
FIG. 2b illustrates a phase shift circuit.
Figure 3:
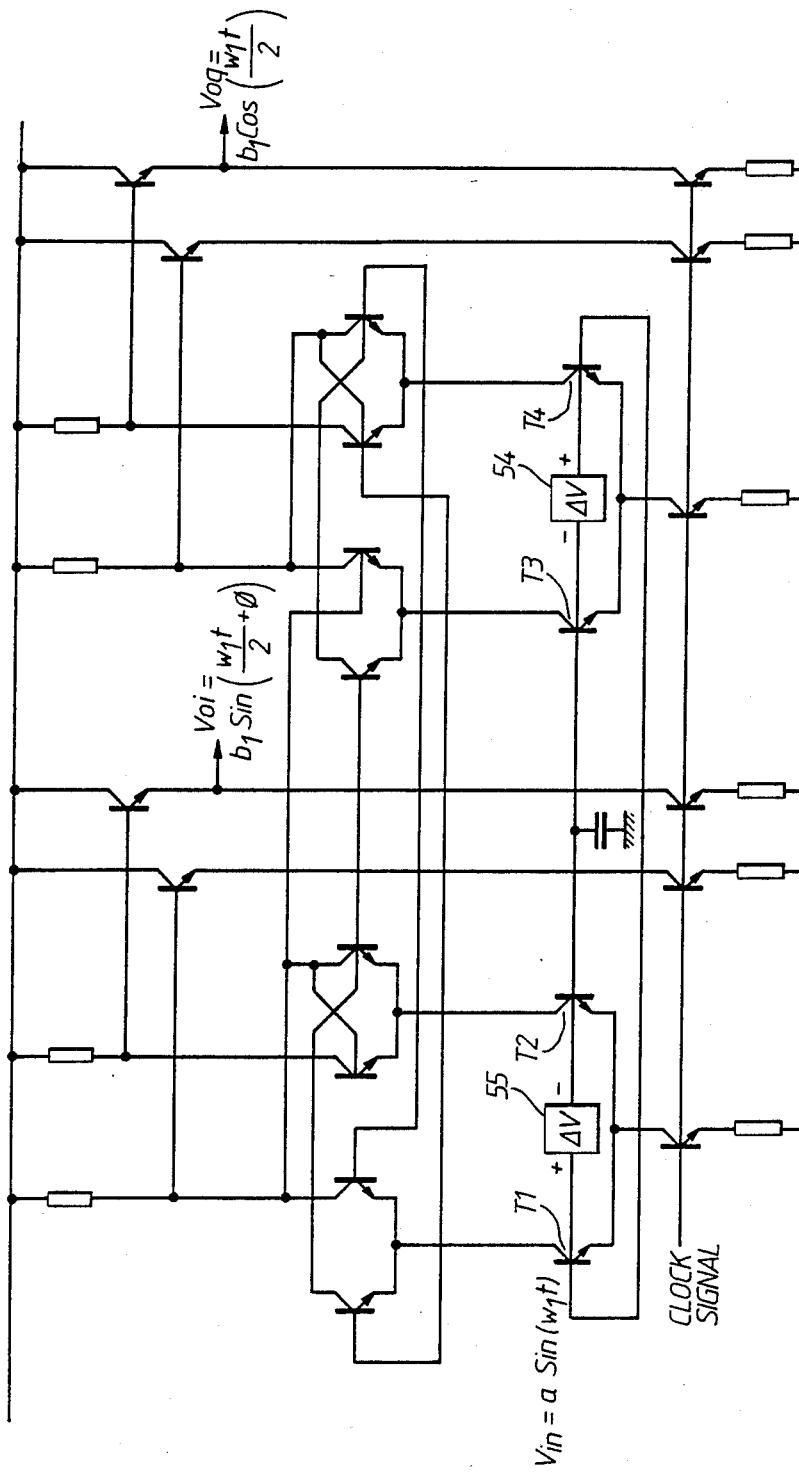
FIG. 3 illustrates in part symbolic block form a phase shift arrangement according to the present invention.

Consider, FIG. 3 it will be appreciated that the circuit is similar to that illustrated in FIG. 2(b) however voltage biasing means 55, 57 have been placed between the input transistor pairs $T_1$, $T_2$ and $T_3$, $T_4$. These biasing means 55, 57 act to alter the trigger level of the clock pulse upon which the master and slave flip-flops operate.

Figure 4:
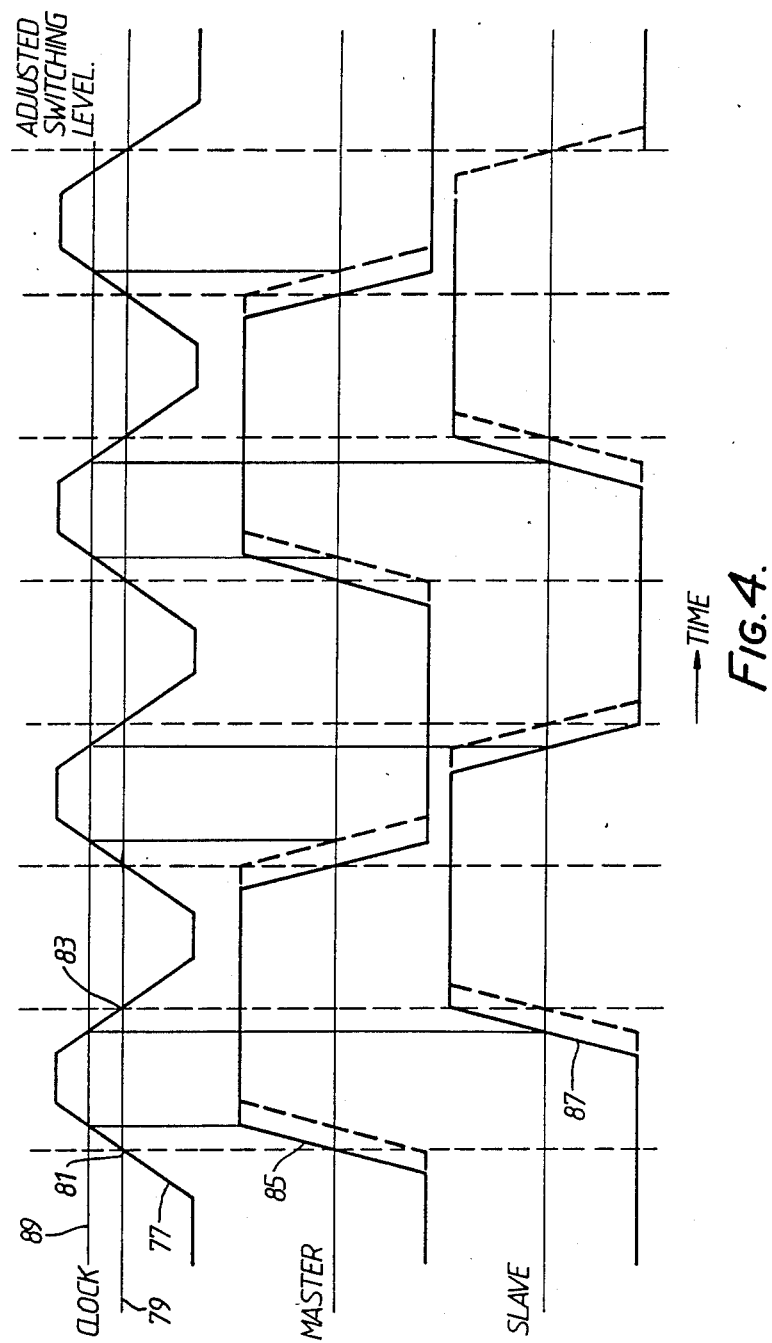
FIG. 4 is a timing diagram of clock, master flip-flop and slave flip-flop signals, for the phase shift arrangement illustrated in FIG. 1 and, FIG. 5 illustrates a circuit for a phase shift arrangement according to the present invention.

In FIG. 4, a nominal clock signal 77 is illustrated; this clock signal is employed to co-ordinate switching the master and slave flip-flops whereby a 90° phase shift may be achieved. A flip-flop switching level 79 is set upon the clock pulse 77, typically the master flip-flop is switched upon the leading edge 81 while the slave flip-flop is switched on the trailing edge 83. Thus, as can be seen from the timing diagrams (85, 87) for the master and slave flip-flop's, a 90° phase shift is induced. It will be appreciated that alternative degrees of phase shift may be achieved by altering the relative clock timing to the D flip-flop input pulse.

The timing diagrams of FIG. 4 are idealised in that no account has been made of phase distortion effects. It will be apparent that switch timing delays and parasitic impedance will lead to displacements of the true phase shift compared to the ideal. In the present invention, phase shift distortion or displacement effects are corrected by offsetting or biasing the clock switching level of respective master and slave flip-flop elements to an offset level 89. Consequently, by adjusting the clock switching level offset, a desired phase shift can be accurately achieved.

Figure 5:
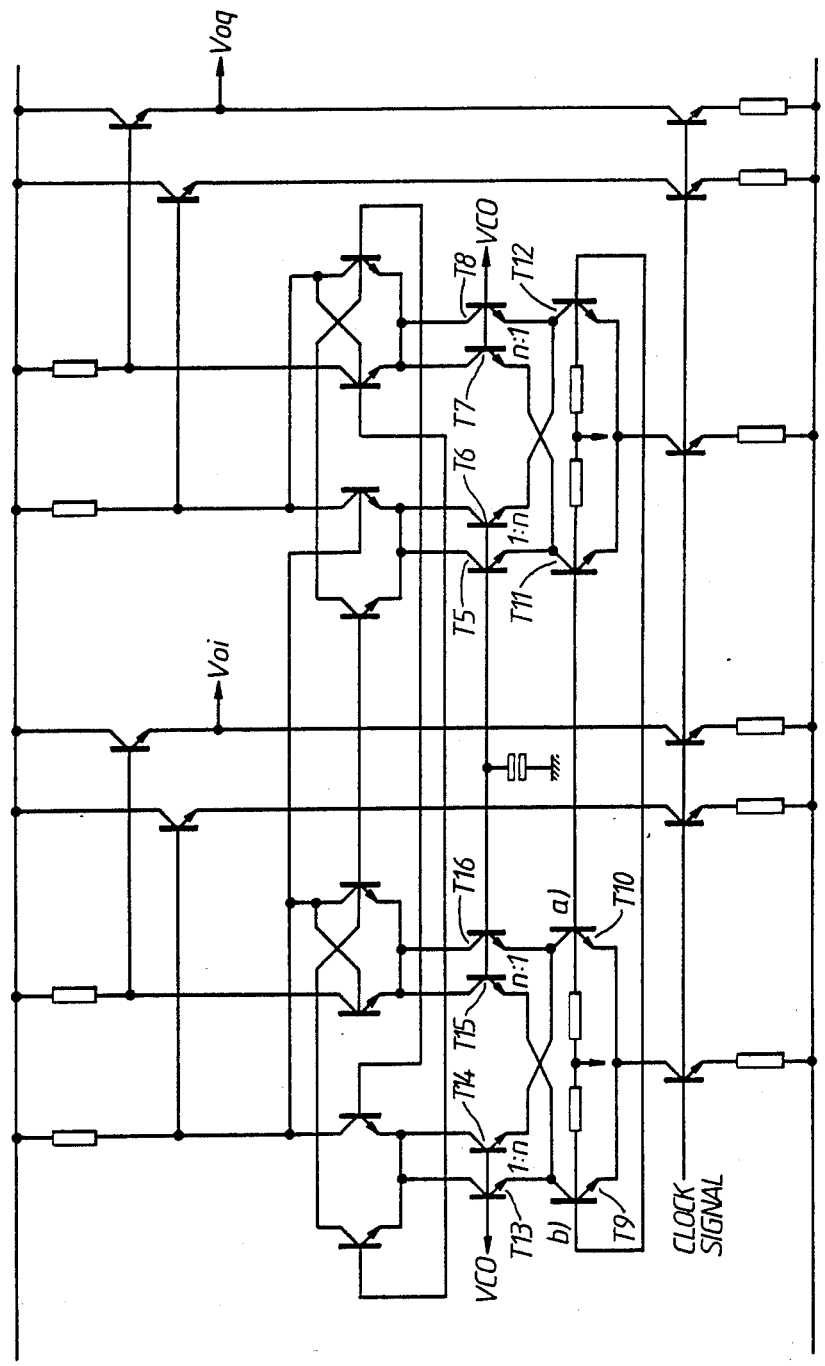

A practical arrangement for providing clock switching level bias is shown in FIG. 5. The input transistors $T_1$ to $T_4$ of FIG. 2 have been replaced by transistors $T_5$ to $T_{16}$ to provide the flip-flop switching arrangements. If we consider the master flip-flop switching arrangement comprising $T_9$, $T_{10}$, $T_{13}$ to $T_{16}$, if transistors $T_{14}$ and $T_{15}$ have a different emitter area to the other transistors it becomes possible to adjust the input offset by sinking or sourcing current into point (a) [or (b)]. To appreciate this offset, consider the situation when all current flows through transistors $T_{13}$, $T_{15}$, $T_6$ and $T_8$ i.e. when current is sourced into point (b). Here the active circuitry becomes equivalent to that shown in FIG. 3 with the switching offset $\Delta V = \Delta V_{be} = KT/q \cdot \log(n)$ where $\Delta V$ = Potential Difference, K = Boltzmann Constant, T = Temperature, q = charge and n = number of charge carriers. Conversely, if current is sunk from point (b) all the current will flow through transistors $T_{14}$, $T_{16}$, $T_5$ and $T_7$ and the circuit becomes equivalent to FIG. 2(b) but the switching offset $\Delta V = \Delta V_{be} = -KT/q \cdot \log(n)$. The switching offset $\Delta V$ can take any value between these two extremes of adjustment by varying the controlling current at point (b).

The inventive arrangement described allows the phase to be adjusted between two quadrature signals by adjusting the offset on the input switches of a divide by two flip-flop arrangement. Alternative approaches that may be used include independently biasing the input transistors of the arrangement shown in FIG. 2(b) or applying external voltage differentials (55, 57) as shown in FIG. 3.

The principle may be extended to phase adjustment of signals other than by 90° i.e. by applying it to arrangements which divide by a ratio other than two (e.g. four, eight etc).

Typically, the switching offset will be of the order of 15° although greater offsets may be possible allowing provision of irregular phase shifts.

It will be appreciated that the present phase shift arrangement could be used with advantage in any system which requires accurately phase related signals.

I claim:

1. A phase shift arrangement arranged to be coupled to a clock pulse source, said clock pulse source being arranged to provide clock pulse signals, the phase shift arrangement including bi-stable means, said bi-stable means comprising a first bi-stable device and a second bi-stable device, said bi-stable means being coupled to said clock pulse source to allow said first bi-stable device and said second bi-stable device to be triggered by a predetermined level of said clock pulse signal from said clock pulse source, said triggered first bi-stable device being arranged to provide first output signals, said triggered second bi-stable device being arranged to provide second output signals, said first output signals, having a specified phase relation with said second output signals, said first bi-stable device and said second bi-stable device respectively each including bias means, said bias means being arranged to adjust the said predetermined level of clock pulse signal at which said first bi-stable device and said second bi-stable device are triggered such that said specified phase relation between said first output signals and said second output signals is determinable.

2. A phase shift arrangement as claimed in claim 1 wherein the bi-stable devices are D-type flip-flop elements arranged in a master-slave configuration.

3. A phase shift arrangement as claimed in claim 1 wherein the specified phase relation is a quadrature phase relation.

4. A phase shift arrangement as claimed in claim 1 wherein said first bi-stable device and said second bi-stable device each including a first pair of transistor switches and a second pair of transistor switches, each transistor switch of said first pair of transistor switches and said second pair of transistor switches having an emitter, said emitters of said first pair of transistor switches being coupled to a first input transistor switch through its collector, said emitters of said second pair of transistor switches being coupled to a second input transistor switch through its collector, said first input transistor switch and said second input transistor switch being coupled by said bias means, and said bias means comprising means to provide a voltage bias between said first input transistor switch and said second input transistor switch.

5. A phase shift arrangement as claimed in claim 4 wherein the means for providing the voltage bias comprises externally accessable nodes whereto a voltage differential may be applied.

6. A phase shift arrangement as claimed in claim 4 wherein the bi-stable device input switches are transistors.

7. A phase shift arrangement as claimed in claim 4 wherein said voltage bias comprises a bias transistor pair coupled in parallel between said first input transistor switch and said second input transistor switch through their respective base, said bias transistor pair comprising a first bias transistor fabricated to have a first emitter area and a second bias transistor fabricated to have a second emitter area, said first emitter area and said second emitter area being respectively different in order to provide a voltage bias between said first input transistor switch and said second input transistor switch by ensuring a voltage differential between said first input transistor base and said second input transistor base.

* * * * *